United States Patent [19]
Larson

[11] Patent Number: 4,951,303
[45] Date of Patent: Aug. 21, 1990

[54] HIGH SPEED DIGITAL PROGRAMMABLE FREQUENCY DIVIDER

[76] Inventor: Lawrence E. Larson, 822 19th St., Santa Monica, Calif. 90403

[21] Appl. No.: 264,935

[22] Filed: Oct. 31, 1988

[51] Int. Cl.$^5$ .................... H03K 23/44; H03K 23/48
[52] U.S. Cl. .................... 377/110; 377/105; 377/118; 377/72; 377/79
[58] Field of Search .................... 377/47, 48, 72, 73, 377/74, 78, 79, 104, 105, 110

[56] References Cited

U.S. PATENT DOCUMENTS

| | | | |
|---|---|---|---|
| 3,678,398 | 7/1972 | Thomenius | 377/110 |
| 3,945,194 | 3/1976 | Gollinger | 377/110 |
| 3,946,255 | 3/1976 | Stein | 377/72 |
| 3,992,635 | 11/1976 | Suzuki et al. | 377/74 |
| 4,041,403 | 8/1977 | Chiapparoli | 377/48 |
| 4,181,861 | 1/1980 | Maehashi | 377/79 |
| 4,193,037 | 3/1980 | Kyu | 377/110 |
| 4,584,698 | 4/1986 | Sibigtroth et al. | 377/110 |

Primary Examiner—John S. Heyman
Attorney, Agent, or Firm—Paul M. Coble; Wanda K. Denson-Low

[57] ABSTRACT

A high speed digital programmable frequency divider (100) capable of frequency division by even and odd integers is disclosed herein. The frequency divider (100) of the present invention includes a waveform generator (200) for providing a periodic input waveform of a first period and the inverse thereof. The present invention further includes a clocked ring oscillator circuit (400) for providing first and second closed signal paths, in response to the input waveform, disposed to invert signals passing therethrough. The first and second signal paths have a common output node (499) and first and second propagation delays substantially equal to first and second integral multiples of the first period, respectively. In addition, the frequency divider (100) includes a programmable switch network (500) for opening the first and second signal paths to provide a periodic output waveform at the output node (499).

3 Claims, 3 Drawing Sheets

| FREQUENCY DIVISOR | $C_0$ | $C_1$ | $C_2$ | $C_4$ | $C_6$ | $C_8$ |
|---|---|---|---|---|---|---|
| 2 | 1 | 1 | 1 | 1 | 0 | 0 |
| 3 | 1 | 0 | 1 | 1 | 0 | 0 |
| 4 | 0 | 1 | 0 | 1 | 1 | 0 |
| 5 | 1 | 0 | 0 | 0 | 1 | 0 |
| 6 | 1 | 1 | 0 | 0 | 1 | 1 |
| 7 | 0 | 0 | 0 | 0 | 1 | 1 |
| 8 | 0 | 1 | 0 | 0 | 0 | 1 |

HIGH SPEED DIGITAL PROGRAMMABLE FREQUENCY DIVIDER

BACKGROUND OF THE INVENTION

1. Field of the Invention:

The present invention relates to digital frequency dividers. More specifically, the present invention relates to digital programmable frequency dividers.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art:

Digitally programmable frequency dividers are utilized in a variety of digital signal processing applications. For example, conventional digital programmable frequency dividers are employed in phase locked loops included within high frequency digital communication systems. The bandwidth of the composite digital communication system is typically defined by the bandwidth of the phase locked loop. As the bandwidth of the phase locked loop is determined by the maximum operating frequency of the associated frequency divider, it follows that the bandwidth of the communication system is also determined thereby. Accordingly, increases in the speed (operating frequency) of digital frequency dividers allow for increases in the bandwidth of digital communication systems.

The speed of a digital frequency divider is determined by the number of gate delays within the critical path of the divider. The critical path of a digital circuit corresponds to the longest unclocked signal path included therein. The maximum speed of a digital frequency divider is typically inversely proportional to one half of the composite gate delay experienced by a signal traversing the critical path. Unfortunately, existing frequency divider circuits employing static flip-flops and other digital logic generally require four to eight complex (as opposed to simple inverting) gates in the critical path. Critical path delays of this duration limit the speed of digital dividers to less than desired values in advanced communication systems.

In applications requiring division by even integers, Johnson counters have been utilized in frequency dividers capable of operating at higher frequencies than conventional frequency dividers. A Johnson counter includes a ring of D-type flip-flops separated by transmission gates. The signal to be divided and the inverse thereof are applied to adjacent transmission gates and the frequency division ratio is determined by the number of flip-flops included within the ring. High speed Johnson counters operate at higher frequencies than conventional frequency dividers by utilizing dynamic D-type flip-flops. Nonetheless, digital signal processing in advanced communication systems typically necessitates frequency division by both even and odd integers.

Hence, a need in the art exists for a high speed digital programmable frequency divider capable of frequency division by even and odd integers.

SUMMARY OF THE INVENTION

The need in the art for a high speed digital programmable frequency divider capable of frequency division by even and odd integers is addressed by the high speed digital programmable frequency divider of the present invention. The frequency divider of the present invention includes a waveform generator for providing a periodic input waveform of a first period and the inverse thereof. The present invention further includes a clocked ring oscillator for providing first and second closed signal paths, in response to the input waveform, disposed to invert signals passing therethrough. The first and second signal paths have a common output node and first and second propagation delays substantially equal to first and second integral multiples of the first period, respectively. In addition, the frequency divider includes a programmable switch for opening the first and second signal paths to provide a periodic output waveform at the output node.

DETAILED DESCRIPTION OF THE INVENTION

Figure 1:
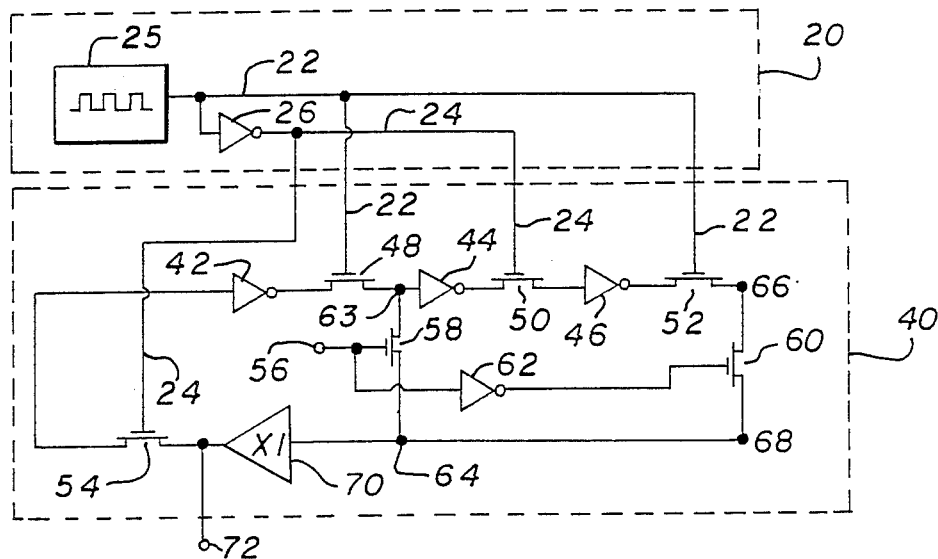
FIG. 1 is a simplified illustrative embodiment of the digital programmable frequency divider of the present invention adapted to effect frequency division by even integers.

FIG. 1 is a simplified illustrative embodiment of the digital programmable frequency divider 10 of the present invention. For the purpose of illustration, the embodiment of FIG. 1 is adapted to divide by even integers only. Subsequent embodiments of the present invention described below are capable of division by either even or odd integers.

As is shown in FIG. 1 and discussed below, the frequency divider 10 includes a square wave generator circuit 20 for providing a square wave (clock signal) on a signal line 22 and the inverse thereof on a signal line 24. The square wave on the line 22 is supplied by a conventional square wave generator 25 while the line 24 is coupled to the generator 25 by an inverter 26. The circuit 20 is operatively coupled to a clocked ring oscillator 40 by the signal lines 22 and 24. The ring oscillator 40 includes first, second and third signal inverters 42, 44 and 46 serially connected via first, second, third and fourth clocked transmission gates 48, 50, 52 and 54. The transmission gates 48 and 52 are coupled to the signal line 22 while the gates 50 and 54 are coupled to the line 24. The transmission gates 48, 50, 52 and 54 control the propagation of signals through the ring oscillator 40 in response to the square wave and inverse thereof provided by the generator circuit 20.

A first signal path is created within the clocked ring oscillator 40 by applying a logic 1 to a control terminal 56. The presence of a logic 1 on the terminal 56 turns on a transistor switch 58 and turns off a transistor switch 60 linked to the terminal 56 by an inverter 62. It follows that a short circuit effectively exists between terminals 63 and 64 while an open circuit is created between terminals 66 and 68. Thus, the first signal path includes the signal inverter 42, the transmission gates 48 and 54, the switch 58 and a unity gain buffer amplifier 70. Similarly, application of a logic 0 to the control terminal 56 creates a second signal path which includes the signal inverters 42, 44 and 46, the transmission gates 48, 50, 52 and 54, the transistor switch 60 and the unity gain buffer amplifier 70.

Selection of the first signal path through application of a logic 1 to the control terminal 56 results in an output waveform of one half the frequency of the input square wave appearing at an output terminal 72. This is illustrated by considering the application of a logic 1 to the output terminal 72 subsequent to the lowering of the line 24 by the generator circuit 20. Following a delay of one half period of the input square wave the line 24 is raised and the logic from the terminal 72 is passed by the gate 54 and inverted by the inverter 42 to a logic 0. After a second delay of one half period the line 22 is raised and the logic 0 passes though the gate 48, the switch 58, and the buffer 70 to the output terminal 72. As there is an odd number of signal inverters within each signal path, inclusion of the buffer amplifier 70 within each path ensures proper timing of the waveform impressed on the output terminal 72. Hence, the output terminal 72 changes state after one period (two half periods) of the input waveform. In this manner the frequency of the input waveform is divided by two. Similarly, selection of the second signal path gives rise to an output waveform of one fourth the frequency of the input square wave at the output terminal 72. It follows that the simplified embodiment 10 of the present invention divides the frequency of a periodic input waveform either by two or by four.

Figure 2:
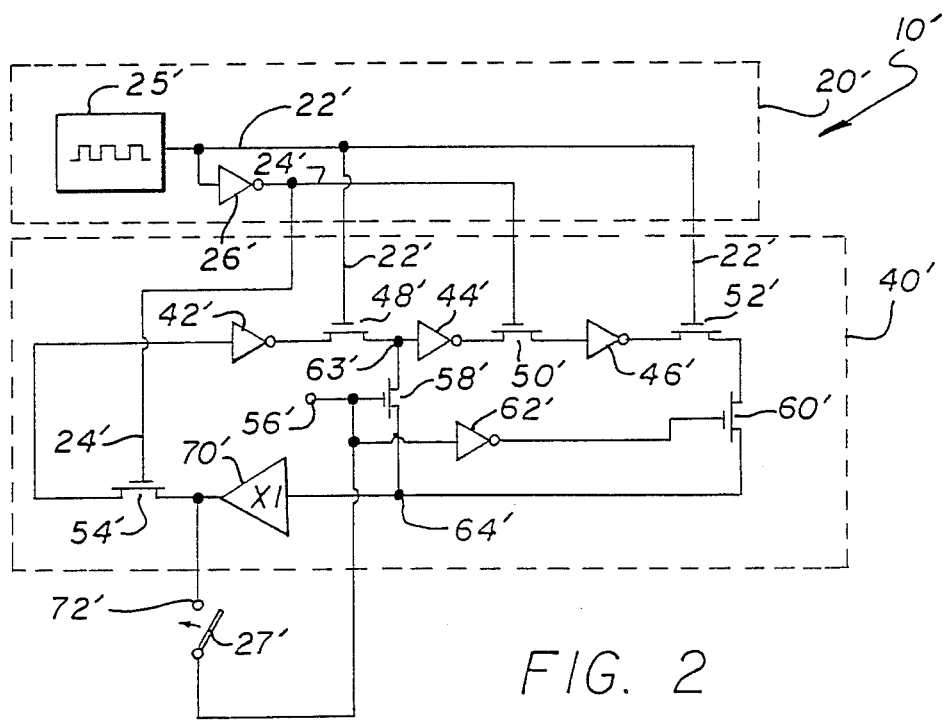
FIG. 2 is an improved simplified embodiment of the digital programmable frequency divider of the present invention disposed to divide by even and odd integers.

FIG. 2 shows an improved simplified embodiment of the digital programmable frequency divider 10' of the present invention adapted to divide the frequency of an input square wave provided by a square wave generator circuit 20' by the even integers two and four and also by the odd integer three. The divider of FIG. 2 is substantially identical to the divider of FIG. 1 with the exception of the addition of a switch 27' which, when closed, links the control terminal 56' with the output terminal 72'. The divider 10' divides the frequency of the input square wave by two or four as described above with respect to the divider 10 with the switch 27' open and a logic 1 or 0 applied to the terminal 56'. Alternatively, the divider 10' generates a periodic waveform at one third the frequency of the input square wave supplied thereto by the generator circuit 20 when the switch 27' is closed. Closing the switch 27' induces the voltage present at the output terminal 72' to be impressed on the control terminal 56'. It follows that the first and second signal paths will be alternately selected by the control terminal 56' as the voltage at the output terminal 72' switches between a logic 1 and a logic 0.

Figures 3, 5:
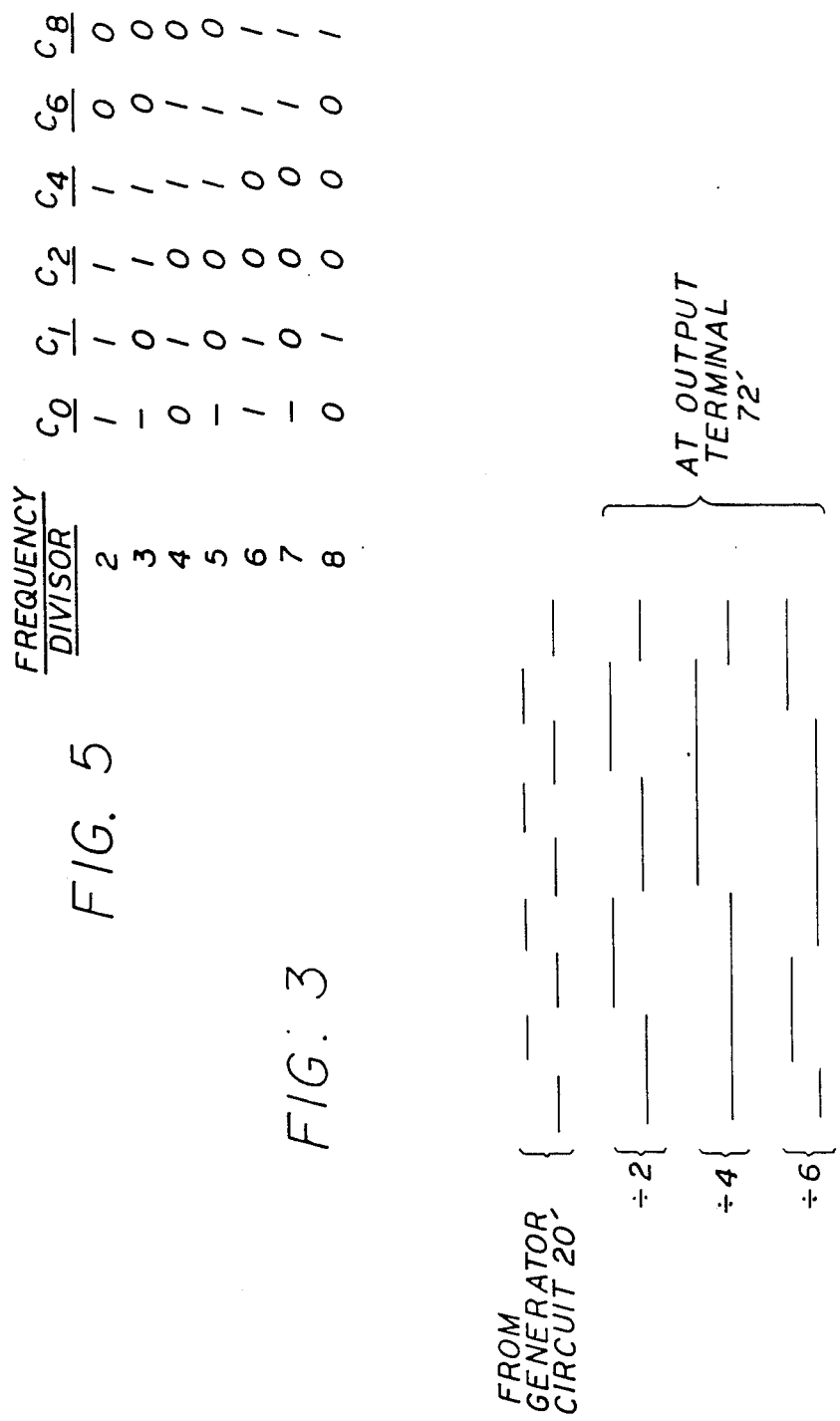
FIG. 3 is a timing diagram showing an input waveform and the waveforms corresponding to frequency division thereof by two, three and four.
FIG. 5 is a table which includes the relative phasing of the control switches included in the embodiment of FIG. 4 required for frequency division by the integers two through eight.

To illustrate the manner in which the frequency divider 10' divides by three, consider the application of a logic 1 to the output terminal 72' subsequent to the lowering of the line 24' by the generator circuit 20'. Following a delay of one half period of the input square wave the line 24' is raised and the logic 1 from the terminal 72 is passed by the gate 54' and inverted by the inverter 42' to a logic 0. After a second delay of one half period the line 22' is raised and the logic 0 passes though the gate 48', the switch 58', and the buffer 70' to the output terminal 72'. Hence, the output terminal 72 remains at a logic 1 for one period (two half periods) of the input waveform prior to transitioning to a logic 0. The change of state of the output terminal 72' to a logic 0 causes the the second signal path to be selected by turning off the transistor switch 58' and turning on the transistor switch 60'. It follows that after one half period subsequent to the output terminal 72' transitioning to a logic 0 the line 24' will be raised and the logic 0 will be passed by the gate 54' and inverted to a logic 1 by the signal inverter 42'. In a similar fashion the logic 1 is inverted to a logic 0 by the inverter 44' and inverted back to a logic 1 by the inverter 46'. The logic 1 engendered by the inverter 46' is passed by the transistor gate 52', the transistor switch 60' and the buffer 70' to the output terminal 72'. Hence, the output terminal remains at a logic 0 four two periods of the input waveform and at a logic 1 for one period. As the output terminal 72' transitions to a logic 1 once every three periods of the input waveform the frequency of the input waveform has effectively been divided by three. FIG. 3 is a timing diagram showing the input square wave and the waveforms present at the output terminal 72' corresponding to frequency division thereof by two, three and four.

It is evident upon inspection of FIG. 2 that the maximum speed of operation of the divider 10' will typically be independent of the time required to switch between the first and second signal paths. That is, as it is required to switch between the first and second signal paths at most after one period of the input waveform, the response time of the switch transistors 58' and 60' may be slow relative to the rise time of the inverters 42', 44' and 46'. As was mentioned in the Background of the Invention, digital frequency dividers utilizing Johnson counters are also capable of high speed operation but are unable to divide the frequency of an input waveform by odd integers. It follows that a feature of the present invention is that frequency division by both even and odd integers may be effected by the divider 10' at a speed principally limited only by the short propagation delays of the signal inverters. An additional advantage of the present invention is that an increase in the division ratio does not degrade the maximum attainable operational speed. Further, the particular speed (frequency) of operation of the divider 10' is determined by the input waveform and is essentially independent of the gate delay of the inverting stages.

Figure 4:
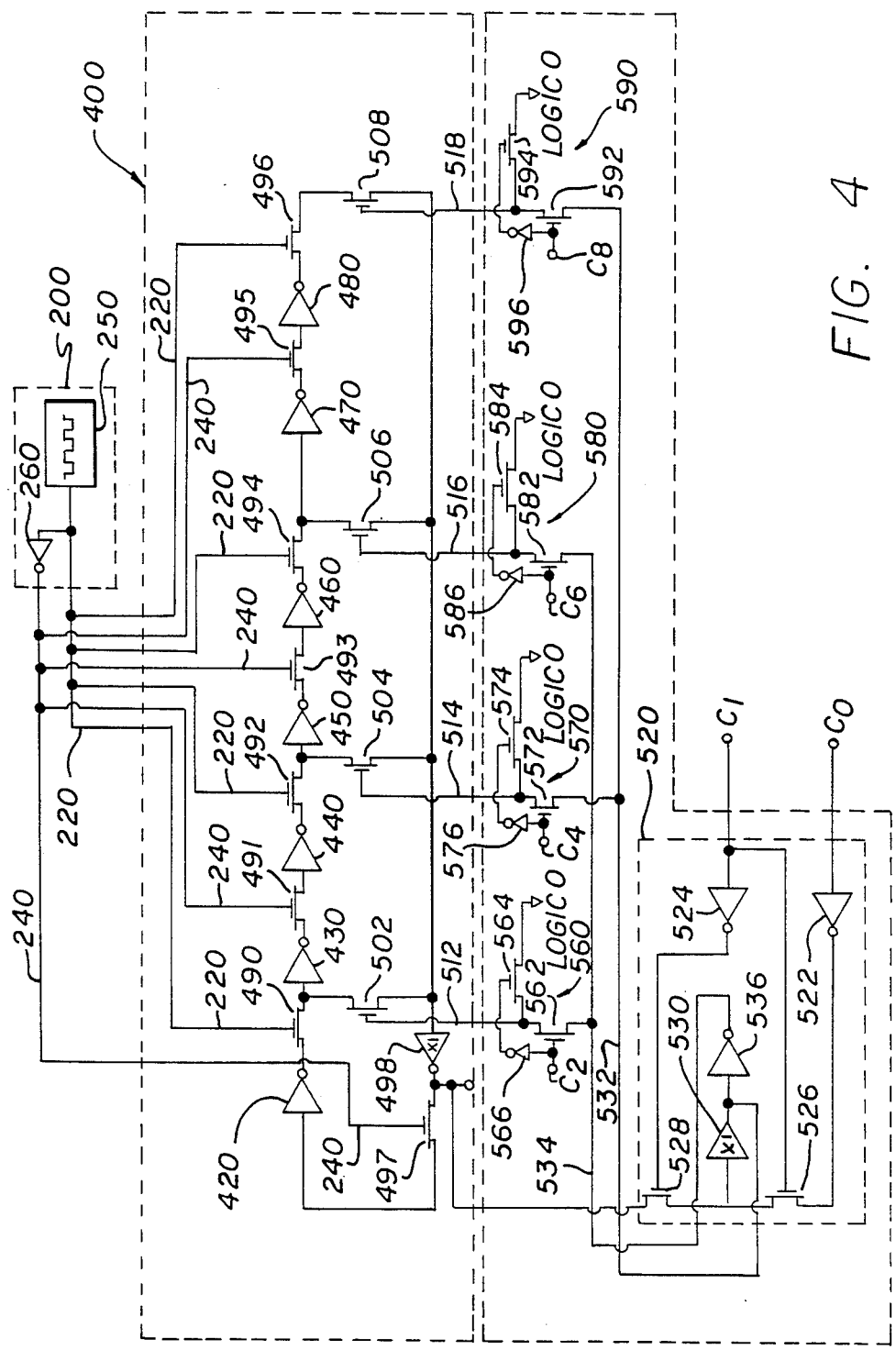
FIG. 4 is a preferred embodiment of the frequency divider of the present invention.

FIG. 4 is a partially schematic, partially block diagrammatic representation of a preferred embodiment of the digital programmable frequency divider 100 of the present invention. The divider 100 is capable of dividing the frequency of a digital, periodic waveform by the integers two through eight, inclusive. With access to the teachings herein one skilled in the art may augment the embodiment 100 to allow frequency division by larger integer values. The frequency divider 100 includes a square wave generator circuit 200 for providing a square wave on a signal line 220 and the inverse thereof on a signal line 240. The square wave on the line 220 is supplied by a conventional square wave generator 250 while the line 240 is coupled to the generator 250 by an inverter 260. The circuit 200 is operatively coupled to a clocked ring oscillator 400 by the signal lines 220 and 240. The ring oscillator 400 includes first, second, third, fourth, fifth, sixth and seventh signal inverters 420, 430, 440, 450, 460, 470 and 480. The signal inverters are serially connected via first, second, third, fourth, fifth, sixth, seventh and eighth clocked transmission gates 490, 491, 492, 493, 494, 495, 496 and 497. The transmission gates 490, 492, 494 and 496 are coupled to the signal line 220 while the gates 491, 493, 495 and 497 are coupled to the line 240. Again, the transmission gates 490, 491, 492, 493, 494, 495, 496 and 497 control the propagation of signals through the ring oscillator 400 in response to the square wave and inverse thereof provided by the generator circuit 200. The output of the divider 100 is sampled from an output node 499 coupled to the transmission gate 497 and isolated from the remainder of the oscillator 400 by a unity gain buffer amplifier 498.

A programmable switch network 500 is operatively coupled to first, second, third and fourth transistor switches 502, 504, 506 and 508 by first, second, third and fourth control lines 512, 514, 516 and 518, respectively. The switches 502, 504, 506 and 508 are controlled to create first, second third and fourth signal paths within the ring oscillator 400 in a manner substantially similar to that discussed above with respect to FIGS. 1 and 2. For example, the programmable switch network 500 actuates the third signal path within the ring oscillator 400 by turning on the switch 506 and by turning off the remaining switches 502, 504 and 508. The programmable switch network 500 includes a control circuit 520 coupled to the control lines 512, 514, 516 and 518 through first, second, third and fourth programmable switch drivers 560, 570, 580 and 590.

The control circuit 520 includes a pair of input terminals $C_0$ and $C_1$. The terminal $C_0$ is coupled to a signal inverter 522 while the terminal $C_1$ is coupled both to a signal inverter 524 and to the control terminal of a transistor gate 526. In addition, the output of the inverter 524 is directly connected to the control terminal of a transistor gate 528. The control circuit further includes a unity gain buffer amplifier 530 operatively coupled to the transistor gates 526 and 528. The control circuit 520 provides control voltages to the switch drivers 560, 570, 580 and 590 via a pair of signal lines 532 and 534. The signal line 532 is connected to the output of the buffer amplifier 530. The signal line 534 is coupled to an inverter 536 which is also in communication with the output of the buffer amplifier 530.

The control circuit 520 and switch drivers 560, 570, 580 and 590 synchronously determine the frequency division ratio effected by the clocked ring oscillator 400. The control circuit 520 is programmed through the application of logical (1 or 0) voltages to the terminals $C_0$ and $C_1$. Similarly, the switch drivers are programmed by applying logical voltages to the terminals $C_2$, $C_4$, $C_6$ and $C_8$. More specifically, a logic 1/0 is applied to terminal $C_1$ for frequency division by even-/odd integers. Terminal $C_0$ is utilized when the divider 100 is being employed to divide by an even integer. In particular, a logic 0 is applied to terminal $C_0$ for division by an even multiple of two (e.g. 4, 8) while a logic 1 is used for division by an odd multiple of two (e.g. 2, 6). A complete table of the relative phasing of the control voltages impressed on the terminals $C_0$, $C_1$, $C_2$, $C_4$, $C_6$ and $C_8$ for each desired frequency divisor is given in FIG. 5.

The operation of the control circuit 520 in conjunction with the switch drivers to select a desired signal path (and hence frequency division ratio) within the clocked ring oscillator 400 may be further understood by consideration of the case of frequency division by, for example, the integer five. As shown in FIG. 5 the input square wave supplied by the generator circuit 200 is divided in frequency by the integer five by applying a logic 1 to terminals $C_4$ and $C_6$ and by applying a logic 0 to terminals $C_1$, $C_2$ and $C_8$. As mentioned above the terminal $C_0$ is unused during division by odd integers and is decoupled from the control circuit 520 by turning off the transistor 526 via the terminal $C_1$. Application of a logic 0 to terminal $C_1$ turns on transistor 528 which places the control circuit 520 in electrical communication with the output node 499. It follows that the logical voltage on the output node 499 is impressed on the signal line 532 through the buffer amplifier 530 and the inverse thereof is impressed on the line 534 by the signal inverter 536. In this way the lines 532 and 534 mirror the voltage on the output node 499 and inverse thereof, respectively.

Since terminal $C_2$ is held at logic 0 transistor switch 562 is turned off and transistor switch 564 is turned on via signal inverter 566 while effecting frequency division by the integer five. Thus transistor switch 504 is turned off, and the first signal path within the oscillator 400 is open circuited by the logic 0 passed by the transistor switch 564. Similarly, the logic 0 impressed on terminal $C_8$ turns off transistor switch 592 and turns on transistor switch 594 via signal inverter 596. In this manner switch 508 is turned off, and the fourth signal path of the oscillator 400 is open circuited by the logic 0 passed by the switch 594.

As terminals $C_4$ and $C_6$ are held at a logic 1, transistor switches 572 and 582 are turned on and transistor switches 574 and 584 are turned off via inverters 576 and 586. Hence, the switches 504 and 506 within the ring oscillator 400 are controlled by the logical state of the output node 499 and the inverse thereof, respectively. As a consequence, as the logical state of the output node 499 toggles between a 1 and 0 the second and third signal paths of the ring oscillator 400 are alternately actuated. In this manner the output node 499 transitions to a logic 1 once every ten half periods of the input waveform. As the input waveform transitions to a logic 1 five times every ten half periods, the frequency of the input waveform has thus been divided by five.

In the preferred embodiment of FIG. 4, the electrical components are realized with field effect devices. In particular, the transistor switches and signal inverters are preferably fabricated using conventional MOSFET's or GaAs MESFET's for suitably high speed operation. As mentioned above, however, the maximum operating speed of the frequency divider of the present invention is determined primarily by the rise time of the inverting stages and is generally unaffected by the speed of the transistor switches. The electrical devices within the clocked ring oscillator 400 and the programmable switch 500 may be implemented with discrete elements or may be photolithographically etched on a semiconductor wafer using masking processes familiar to those skilled in the art.

Thus the present invention has been described with reference to a particular embodiment in connection with a particular application. Those having ordinary skill in the art and access to the teachings of the present invention will recognize additional modifications and applications within the scope thereof. For example, the embodiments of the frequency divider of the present invention described above may be augmented to effect frequency division ratios larger than those disclosed herein. Similarly, the invention is not limited to the particular digital logic disclosed herein used to select the desired frequency division ratio. Those skilled in the art may be aware of other logic circuits allowing selection of the requisite signal path(s) for a given frequency division ratio. Moreover, those skilled in the art may also be aware of other architectures for dynamically switching between signal paths during frequency division by odd integers which are within the scope of the present invention.

It is therefore contemplated by the appended claims to cover any and all such modifications.

Accordingly,

What is claimed is:

1. A high speed frequency divider comprising:
   means for providing a periodic input waveform having a first period on a first line and the complement thereof on a second line and
   a clocked ring oscillator including
      first, second, third and fourth transmission gates connected in a series relation, each having an input terminal, with the input terminals of said first and third gates being connected to said second line and the input terminals of said second and fourth gates being connected to said first line,
      first, second and third inverters connected between said first and second gates, said second and third gates, and said third and fourth gates respectively, said first inverter connected to a first terminal of said first gate and said third inverter being connected to a first terminal of said fourth gate,
      a first switch having a first terminal connected to the junction between said second gate and said second inverter,
      a second switch having a first terminal connected to a second terminal of said fourth gate, a second terminal of said first switch connected to a second terminal of said second switch,
      a buffer connected between the second terminals of said first and second switches and a second terminal of said first gate, said output of said buffer providing the output of said oscillator and
      means for applying complementary inputs to said first and second switches.

2. The invention of claim 1 including third switch means for selectively connecting the output of said buffer to the inputs of said first switch.

3. A method for providing high speed frequency division including the steps of:
   (a) driving a clocked ring oscillator with a periodic waveform and the complement thereof, said oscillator including:
      first, second, third and fourth transmission gates connected in a series relation, each having an input terminal, with the input terminals of said first and third gates being connected to a source of said periodic waveform and the input terminals of said second and fourth gates being connected to a source of said complement of said periodic waveform,
      first, second and third inverters connected between said first and second gates, said second and third gates, and said third and fourth gates respectively, said first inverter connected to a first terminal of said first gate and said third inverter being connected to a first terminal of said fourth gate,
      a first switch having a first terminal connected to the junction between said second gate and said second inverter,
      a second switch having a first terminal connected to a second terminal of said fourth gate, a second terminal of said first switch connected to a second terminal of said second switch,
      a buffer connected between the second terminals of said first and second switches and a second terminal of said first gate, said output of said buffer providing the output of said oscillator and
      means for applying complementary inputs to said first and second switches and
   (b) feeding the output of said oscillator to the input thereof.

* * * * *